(12) United States Patent
Downey et al.

(10) Patent No.: US 6,846,717 B2
(45) Date of Patent: Jan. 25, 2005

(54) SEMICONDUCTOR DEVICE HAVING A WIRE BOND PAD AND METHOD THEREFOR

(75) Inventors: Susan H. Downey, Austin, TX (US); James W. Miller, Austin, TX (US); Geoffrey B. Hall, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/606,674

(22) Filed: Jun. 24, 2003

(65) Prior Publication Data

US 2004/0036174 A1 Feb. 26, 2004

Related U.S. Application Data

(62) Division of application No. 10/097,059, filed on Mar. 13, 2002, now Pat. No. 6,614,091.

(51) Int. Cl.[7] .............................................. H01L 21/76
(52) U.S. Cl. ....................................... 438/400; 438/618
(58) Field of Search ................................ 438/400, 618; 257/499

(56) References Cited

U.S. PATENT DOCUMENTS

| | | | |
|---|---|---|---|
| 5,506,499 A | 4/1996 | Puar | |
| 5,514,892 A | 5/1996 | Countryman | |
| 5,554,940 A | 9/1996 | Hubacher | |
| 6,124,198 A | 9/2000 | Moslehi | |
| 6,144,100 A | 11/2000 | Shen | |
| 6,232,662 B1 | 5/2001 | Saran | |
| 6,239,494 B1 | 5/2001 | Besser | |
| 6,291,331 B1 * | 9/2001 | Wang et al. | 438/618 |
| 6,303,459 B1 | 10/2001 | Chen | |
| 6,372,661 B1 | 4/2002 | Lin | |
| 6,383,916 B1 | 5/2002 | Lin | |
| 6,392,300 B1 | 5/2002 | Koike | |
| 6,399,997 B1 | 6/2002 | Lin | |
| 6,649,509 B1 * | 11/2003 | Lin et al. | 438/618 |
| 2001/0045670 A1 | 11/2001 | Nojiri | |
| 2002/0001937 A1 * | 1/2002 | Kikuchi et al. | 438/618 |
| 2002/0005582 A1 | 1/2002 | Nogami | |
| 2002/0079552 A1 * | 6/2002 | Koike | 257/529 |
| 2002/0192919 A1 * | 12/2002 | Bothra | 438/381 |

FOREIGN PATENT DOCUMENTS

| | | |
|---|---|---|
| EP | 1069615 A2 | 1/2001 |
| JP | 59181041 | 10/1984 |
| JP | 60074658 | 4/1985 |

OTHER PUBLICATIONS

Schiml et al, "A 0.13$\mu$2CMOS Platform with Cu/Low–k Interconnects for System On Chip Applications," IEEE, Symposium on VLSI Technology Digest of Technical Papers, 2 pp. (2001).
PCT/UW03/07783 PCT International Search Report.

* cited by examiner

Primary Examiner—W. David Coleman
Assistant Examiner—Khiem Nguyen
(74) Attorney, Agent, or Firm—Daniel D. Hill

(57) ABSTRACT

An integrated circuit (50) has a wire bond pad (53). The wire bond pad (53) is formed on a passivation layer (18) over active circuitry (26) and/or electrical interconnect layers (24) of the integrated circuit (50). The wire bond pad (53) is connected to a plurality of final metal layer portions (51, 52). The plurality of final metal layer portions (51, 52) are formed in a final interconnect layer of the interconnect layers (24). In one embodiment, the bond pad (53) is formed from aluminum and the final metal layer pads are formed from copper. The wire bond pad (53) allows routing of conductors in a final metal layer (21) directly underlying the bond pad (53), thus allowing the surface area of the semiconductor die to be reduced.

15 Claims, 2 Drawing Sheets

US 6,846,717 B2

SEMICONDUCTOR DEVICE HAVING A WIRE BOND PAD AND METHOD THEREFOR

CROSS-REFERENCE TO RELATED, COPENDING APPLICATION

This is a division of application Ser. No. 10/097,059, filed Mar. 13, 2002, now U.S. Pat. No. 6,614,091.

A related, copending application Ser. No. 10/097,036 is entitled "Semiconductor Device Having a Bond Pad and Method Therefor", Lois Yong et al., assigned to the assignee hereof, and filed concurrently herewith.

FIELD OF THE INVENTION

The present invention relates generally to semiconductor devices, and more particularly, to a semiconductor device having a wire bond pad and method therefor.

BACKGROUND OF THE INVENTION

In Integrated Circuit (IC) manufacturing it is important for the integrated circuit die to be as small as possible to reduce cost. Wire bonding is a widely used method to connect a semiconductor die having electrical circuitry to a pin on a component package. A bond pad is an electrically conductive metal area on the surface of the IC. Even though improved technology has allowed reduced integrated circuit size, the wire bonding pad dimensions have not scaled as quickly. Therefore, bond pads consume a greater percentage of the overall circuit area. This has also reduced the area available on the IC for routing power busses in the metal layer from which the bond pads are formed.

Copper is now commonly used for interconnects in integrated circuits. However, because of problems wire bonding to copper, a wire bond pad for copper interconnect technologies often utilizes an aluminum layer to cap the exposed copper wire bond pad. This aluminum cap is added to allow use of the same wire bonding tools and processes used in aluminum interconnect technologies.

FIG. 1 illustrates a cross-sectional view of a semiconductor device 10 having a wire bond pad 13 in accordance with the prior art. Semiconductor device 10 includes a silicon substrate 19, interconnect region 20, passivation layer 15 and wire bond pad stack 13. Active circuitry is formed in silicon substrate 19. Interconnect region 20 includes copper layers 21, 22, and 23, and interlevel via layers provide electrical connections between the copper layers 21, 22, and 23 and the active circuitry of substrate 19. In multi-layer metal copper technology the copper portion 12 of the wire bond pad stack 13 is formed from the final, last or top layer 21 of the copper interconnect region 20. A relatively large opening, 50–100 microns ($\mu$m) in both width and height, is cut in the final IC passivation layer 15 to expose the copper pad 12. An aluminum cap 14 is then deposited on the copper pad 12, stepping up onto passivation layer 15 around the perimeter of the wire bond region.

As stated above, on a chip scale, bond pads are quite large. In a typical chip design, I/O (input/output) pad cells are placed in a ring around the periphery of the chip. Bond pads typically cover one half to one quarter of this I/O ring area. Large metal power supply busses are typically routed in this I/O ring as well. In many chip designs, electrical performance may be limited by resistance in these busses. One solution to the bus resistance problem would be to add an additional copper metal layer to the process flow, providing another layer in the bus metal stack, but this entails added cost. Alternately, the I/O ring area could be increased to provide more area for routing power busses, but this also adds cost.

Thus, there is a need for a wire bond pad and power and ground bus that can reduce the severity of the above problems without added cost.

DETAILED DESCRIPTION

Figure 1:
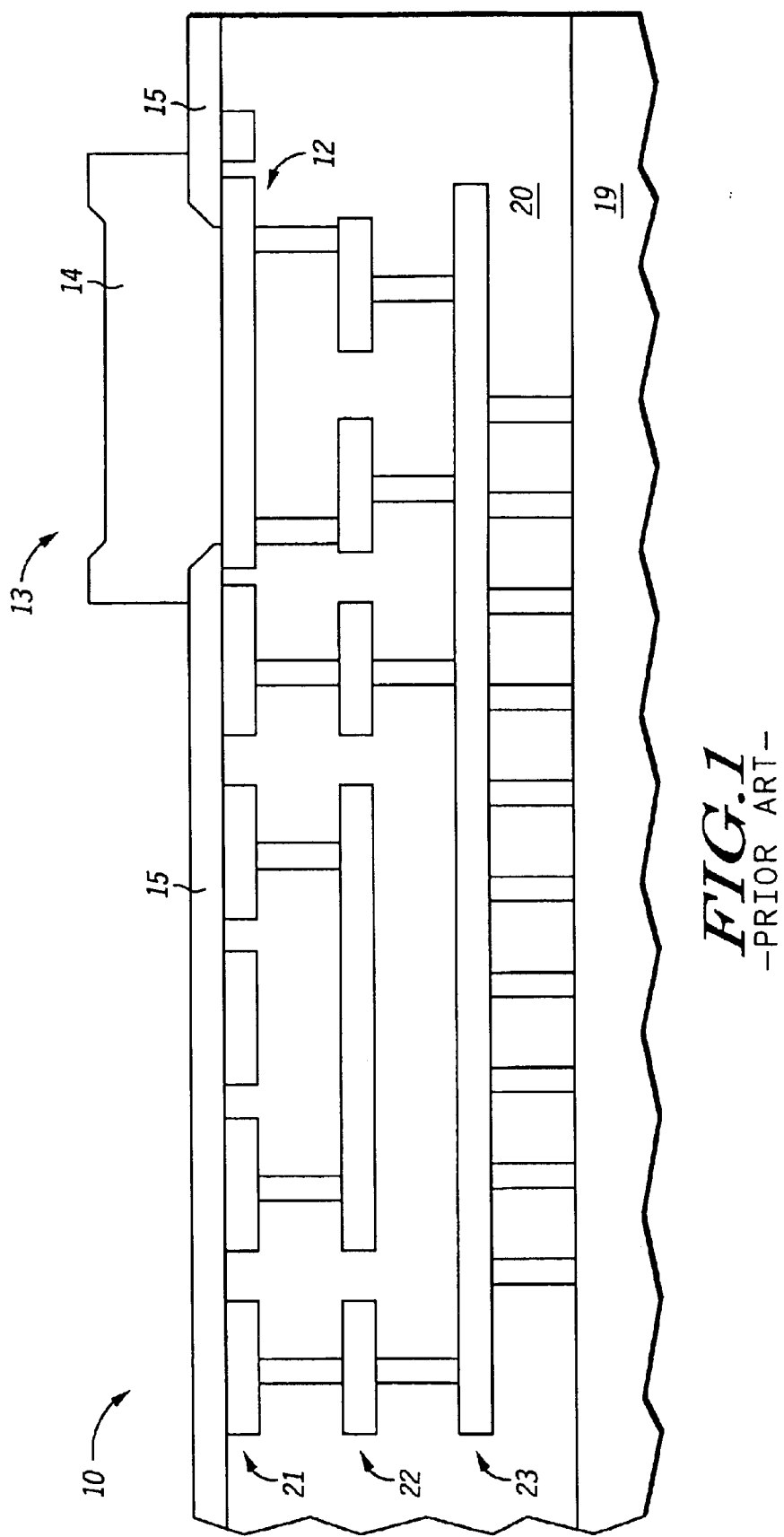
FIG. 1 illustrates a cross-sectional view of a semiconductor device having a wire bond pad in accordance with the prior art.

Generally, the present invention provides an integrated circuit having a bond pad. The bond pad is formed on a passivation layer directly over active circuitry and/or electrical interconnect layers of the integrated circuit. In the illustrated embodiment, the bond pad is formed from aluminum and the electrical interconnect layers are formed from copper. The present invention eliminates most of the copper from the wire bond pad structure shown in FIG. 1. A full standard size aluminum pad is deposited directly on top of the passivation layer. One or more small openings are cut in the passivation layer only as needed to provide electrical connection into the underlying chip circuitry. During deposition of the aluminum cap, the passivation cuts are filled with the aluminum, forming vias to one or more underlying final metal layer copper interconnects. Note that the final metal layer copper interconnects can be quite small, and need only be placed as needed to facilitate efficient interconnections. Large areas of final metal layer copper under the aluminum wire bond pad may now be utilized for power busses, or other interconnects, and may be electrically isolated from the aluminum bond pad above.

In the illustrated embodiment, the aluminum cap for wire bond is part of a standard manufacturing flow. Therefore, the present invention provides the benefit of what is effectively an additional copper metal layer, limited to the area directly under the wire bond pad, with no added cost. Since wire bond pads can be quire large, this can have a significant impact on I/O ring layout area and/or electrical performance The area underneath the wire bond pad can be used for conducting power, ground, or signals across the integrated circuit. Also, the final metal layer copper conductors routed underneath the wire bond pad may be unrelated and independent of the wire bond pad. In addition, by using the area underneath the wire bond pads, the surface area of the semiconductor die may be reduced.

Figure 2:
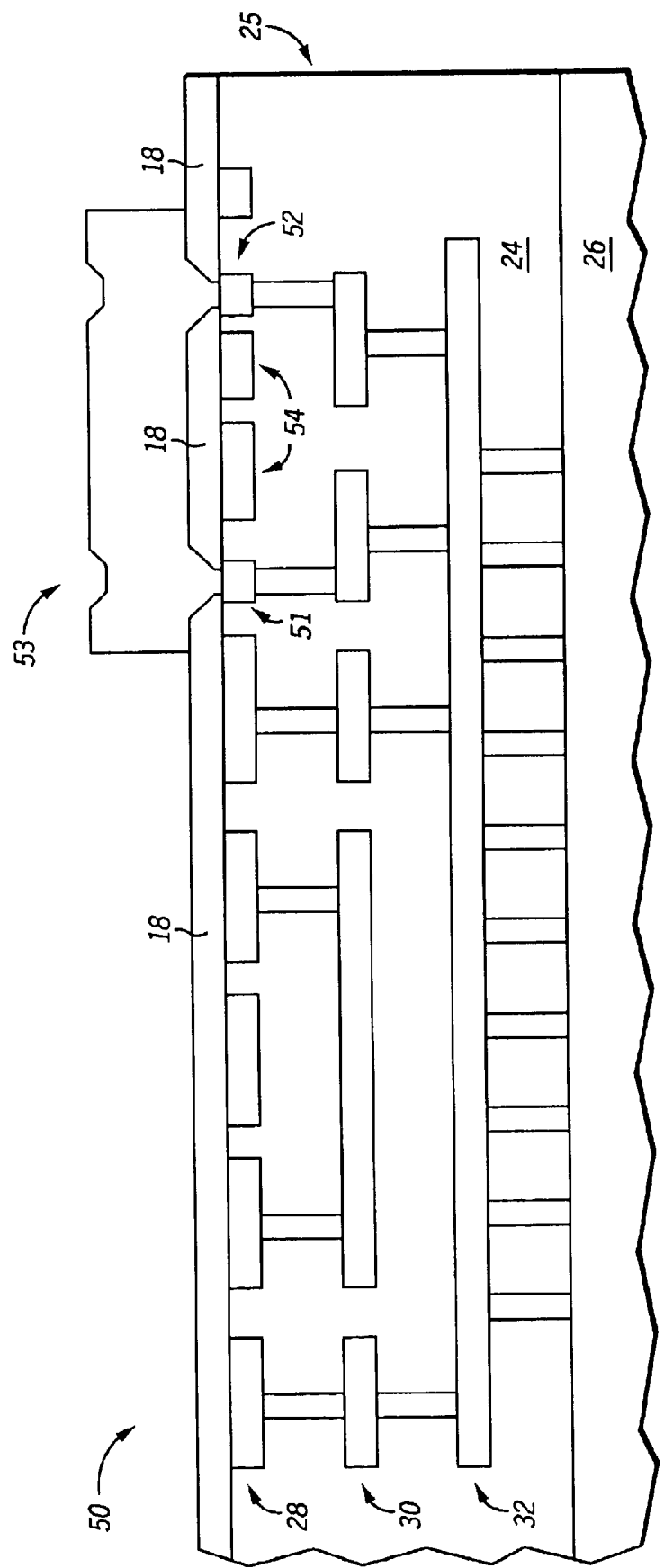
FIG. 2 illustrates a cross-sectional view of a semiconductor device having a wire bond pad in accordance with the present invention.

FIG. 2 illustrates a cross-sectional view of a semiconductor device 50 in accordance with another embodiment of the present invention. Note that the figure is not drawn to scale. Semiconductor device 50 has an edge, or perimeter 25, passivation layer 18, interconnect region 24, substrate or active region 26, and bond pad 53. Note that, in contrast to the prior art aluminum capped copper pad shown in FIG. 1, the pad shown in FIG. 2 is formed only from aluminum. Electrical connection from bond pad 53 to final metal portions 51 and 52 of final metal layer 28 is provided by two aluminum filled vias formed through small cuts in passivation layer 18. Note the depressions in aluminum bond pad 53, where the aluminum has conformally filled the small passivation cuts. Passivation layer 18 covers a large area of the wire bond region under the aluminum pad 53, and electrically isolates portions 54 of copper metal layer 28 from the aluminum bond pad 53. Portions 54 are cross-sections of metal conductors for routing power, ground, or other signals under wire bond pad 53. Portions 54 can traverse a large part of semiconductor device 50 underneath a plurality of adjacent wire bond pads formed along perimeter 25. Portions 54 may, or may not, be connected to wire bond pad 53. Final metal portions 51 and 52 may be any size or shape necessary or desirable for providing an electrical connection to aluminum pad 53 and underlying interconnections. Also, in other embodiments, there may be more than two, or less than two, final metal portions 51 and 52 for electrically connecting the bond pad to the interconnect layers 28, 30, and 32.

In a preferred embodiment, the minimum height or width of a passivation cut is 3 $\mu$m. Minimum sized 3×3 $\mu$m square cuts, as well as rectangular cuts, up to 3×50 $\mu$m are used.

In one embodiment, bond pad 53 is positioned relatively close to perimeter 25 of semiconductor device 50. A plurality of wire bond pads (not shown) similar to bond pad 53 are generally organized along the perimeter 25 to provide external connection to semiconductor device 50. Also, a barrier layer (not shown) may be used as necessary between aluminum pad 53 and final metal portions 51 and 52. The barrier layer may be formed from tantalum. But in other embodiments, the barrier layer may be any material for forming a diffusion barrier and adhesion layer between dissimilar and adjacent materials. Examples of diffusion and barrier materials are tantalum nitride, titanium, titanium nitride, nickel, tungsten, titanium tungsten alloy, and tantalum silicon nitride.

Bond pad 53 may be formed from aluminum and the final metal layer portions 51 and 52 may be formed from copper. However, one skilled in the art will recognize that bond pad 53 may be an alloy comprising aluminum and final metal layer portions 51 and 52 may be an alloy comprising copper. Bond pad 53 is formed from a relatively thick layer of aluminum. Aluminum pad 53 may be between about 0.5 to 2.0 microns thick. Interconnect region 24 includes metal layers 28, 30, and 32 for routing power, ground, signal, and other lines between various components of semiconductor device 20. Note that each of the metal layers 28, 30, and 32 are separated from each other using an insulating material. As discussed above, final metal layer 28 includes conductors directly underneath wire bond pad 53 that are also used for routing power, ground and other signals.

Semiconductor device 50 is subjected to conventional fabrication techniques for forming electrical circuits in substrate, or active region 26. The electrical circuits may be for various integrated circuit applications, such as for example, communications, transportation, general computation, or entertainment. In the illustrated embodiment, metal layers 28, 30, and 32 are formed in conductive materials, for example, aluminum, copper, or gold. In other embodiments, there may be more or fewer metal layers.

The interconnect layers 28, 30, and 32 directly under bond pad 53 can be used for routing one or more electrical conductors 54 for power, ground, and signals across the integrated circuit, thus allowing the overall size of the semiconductor device to be smaller. Also, power and ground wiring layers not directly connected to the bond pads can ring the integrated circuit under the bond pads to provide reduced power bus resistance without increasing the size of the integrated circuit or adding to manufacturing complexity. The actual region where the wire bond is placed on bond pad 53 may be directly over a passivation cut. Alternately, the bond pad 53 may be stretched well beyond the region where the wire bond is placed, in order to provide a connection to a final layer portion 51 or 52 that is remote from the wire bond region. In addition, wire bond pads 53 can be placed anywhere on the integrated circuit, even locations remote from related I/O circuitry, thereby allowing maximum IC design and packaging flexibility. The aluminum wire bond layer can also be used as an interconnect layer, without an overlying passivation layer, to electrically connect, for example, the wire bond pads to other circuit portions. In addition, because final metal layer portions 51 and 52 are not used for probe test or wire bonding, the size and shape of final metal layer portions 51 and 52, and the size and shape of the opening in passivation layer 18, are only constrained by the area needed to provide an electrical connection to bond pad 53. In addition, because the semiconductor device can be made smaller, the number of die per wafer can be increased, thus reducing cost.

In the foregoing specification, the invention has been described with reference to specific embodiments. However, one of ordinary skill in the art will appreciate that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variations thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming an integrated circuit comprising:
    forming a first interconnect layer over a substrate;
    forming a second interconnect layer over the first interconnect layer;
    depositing a passivation layer over the second interconnect layer;
    forming an opening in the passivation layer that exposes a first electrical conductor of the second interconnect layer;
    forming a wire bond pad that electrically connects to the first electrical conductor through the opening in the passivation layer; wherein the bond pad extends over the passivation layer and is positioned directly over a second electrical conductor that is in the second interconnect layer, wherein the second electrical conductor is not directly attached to the wire bond pad and is electrically isolated from the wire bond pad by only the passivation layer; and
    attaching a wire bond to the wire bond pad.

2. The method of claim 1 wherein the first interconnect layer includes copper.

3. The method of claim 1, wherein the second interconnect layer includes copper.

4. The method of claim 1, wherein the passivation layer is further characterized as a final passivation layer.

5. The method of claim 1, wherein the wire bond pad includes aluminum.

6. The method of claim 5, further comprising forming a barrier layer over the first electrical connector before forming the wire bond pad, wherein the barrier layer is positioned between the first electrical connector and the wire bond pad.

7. The method of claim 1, wherein the second electrical conductor is for routing power supply voltage to electrical circuits on the integrated circuit.

8. The method of claim 1, wherein a third conductor is formed using portions of the second interconnect layer and wherein the third conductor is not directly attached to the wire bond pad and routes a power supply voltage under the wire bond pad.

9. A method for forming an integrated circuit comprising attaching a wire bond to a bond pad, wherein the bond pad electrically connects to a first conductor in a final interconnect layer through an opening in a passivation layer, wherein a portion of the bond pad extends over the passivation layer, and wherein the bond pad is substantially directly over a width of a second conductor in the final interconnect layer, the second conductor not directly connected to the bond pad and is electrically isolated from the bond pad by only the passivation layer.

10. The method of claim 9, wherein the wire bond is attached to the portion of the bond pad that extends over the passivation layer.

11. The method of claim 10, further comprising a third electrical conductor directly underlying the portion of the bond pad that extends over the passivation layer, wherein the third conductor is not directly attached to the bond pad.

12. A method of forming a semiconductor device comprising forming a wire bond pad over a passivation layer that electrically connects to a first electrical conductor in a final interconnect layer through an opening in the passivation layer; wherein the bond pad is positioned substantially directly over a width of a second electrical conductor in the final interconnect layer, wherein the second electrical conductor is not directly attached to the wire bond pad and is electrically isolated from the wire bond pad by only the passivation layer.

13. The method of claim 12, wherein the final interconnect layer includes copper.

14. The method of claim 12, wherein the passivation layer is further characterized as a final passivation layer.

15. The method of claim 12, wherein the wire bond pad includes aluminum.

* * * * *